United States Patent
Chu et al.

(10) Patent No.: US 10,334,753 B2
(45) Date of Patent: Jun. 25, 2019

(54) INFORMATION HANDLING SYSTEM WITH INCREASED AIR VELOCITY TO COOL INTERNAL COMPONENTS

(71) Applicant: DELL PRODUCTS, LP, Round Rock, TX (US)

(72) Inventors: Yi-Pai Chu, Taoyuan (TW); Liang-Chun Ma, Taoyuan (TW); Shih-Huai Cho, New Taipei (TW); Hung-Pin Chien, Taipei (TW)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 15/782,357

(22) Filed: Oct. 12, 2017

(65) Prior Publication Data

US 2019/0116688 A1 Apr. 18, 2019

(51) Int. Cl.
*H05K 7/20* (2006.01)
*G06F 1/20* (2006.01)

(52) U.S. Cl.
CPC .......... *H05K 7/20145* (2013.01); *G06F 1/20* (2013.01); *H05K 7/20154* (2013.01)

(58) Field of Classification Search
None
See application file for complete search history.

(56) References Cited

U.S. PATENT DOCUMENTS

| | | | |
|---|---|---|---|
| 6,288,898 B1 | 9/2001 | Johnson et al. | |
| 7,817,417 B2* | 10/2010 | Franz | H05K 7/20145 361/679.49 |
| 7,848,101 B2* | 12/2010 | Dey | G06F 1/20 312/236 |
| 7,974,094 B2* | 7/2011 | Hendrix | H05K 7/20563 361/679.5 |
| 8,767,399 B2* | 7/2014 | Goto | H05K 7/20209 361/679.51 |
| 9,084,374 B2* | 7/2015 | Korikawa | H05K 7/20145 |
| 9,999,161 B2* | 6/2018 | Mease | H05K 7/20172 |
| 2005/0219809 A1* | 10/2005 | Muncaster | E05C 19/06 361/679.33 |
| 2006/0291170 A1* | 12/2006 | Hsiao | G06F 1/20 361/704 |
| 2007/0034368 A1* | 2/2007 | Atkins | G11B 33/142 165/247 |
| 2007/0047200 A1* | 3/2007 | Huang | G06F 1/20 361/695 |
| 2009/0034190 A1* | 2/2009 | Tsai | G06F 1/20 361/695 |

(Continued)

*Primary Examiner* — Courtney L Smith
(74) *Attorney, Agent, or Firm* — Larson Newman, LLP

(57) ABSTRACT

An information handling system includes a component portion and a cooling portion. The component portion includes one or more components of the information handling system. The cooling portion includes a cooling fan and a baffle. The cooling fan provides air flow to the components. The baffle being movable between a first position and a second position to change an area available for the air flow to the components. The baffle is in the first position in response to only a first one of the components being located within the component portion, and the baffle is in the second position in response to both the first component and a second one of the components being located within the component portion.

20 Claims, 6 Drawing Sheets

(56) References Cited

U.S. PATENT DOCUMENTS

| | | | |
|---|---|---|---|
| 2009/0154092 A1* | 6/2009 | Chen | G06F 1/187 361/679.51 |
| 2010/0155047 A1* | 6/2010 | Lin | G05D 23/1932 165/288 |
| 2015/0177750 A1 | 6/2015 | Bailey et al. | |

* cited by examiner

INFORMATION HANDLING SYSTEM WITH INCREASED AIR VELOCITY TO COOL INTERNAL COMPONENTS

FIELD OF THE DISCLOSURE

The present disclosure generally relates to information handling systems, and more particularly relates to an information handling system with increased air velocity to cool internal components.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a component portion and a cooling portion. The component portion includes one or more components of the information handling system. The cooling portion includes a cooling fan and a baffle. The cooling fan may provide air flow to the components. The baffle may be movable between a first position and a second position to change an area available for the air flow to the components. The baffle may be in the first position in response to only a first one of the components being located within the component portion, and the baffle may be in the second position in response to both the first component and a second one of the components being located within the component portion.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
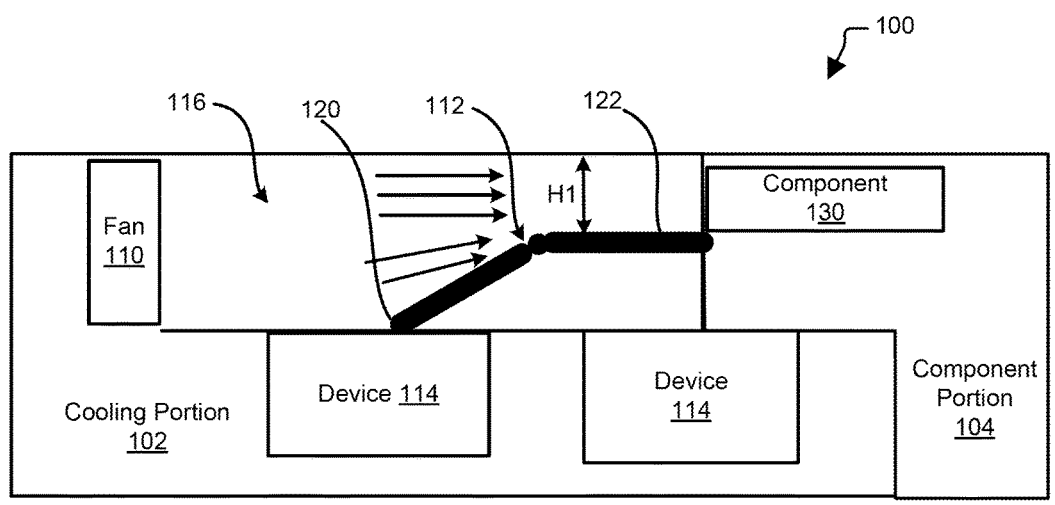
FIG. 1 is a diagram of an information handling system including a baffle in a first position to control air velocity according to at least one embodiment of the disclosure.
Figure 2:
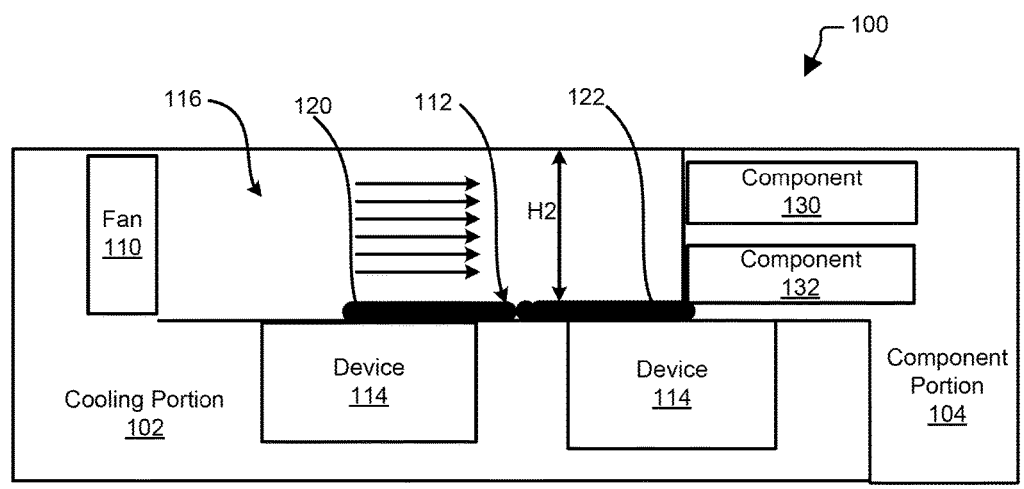
FIG. 2 is a diagram of the information handling system including the baffle in a second position to control air velocity according to at least one embodiment of the present disclosure.

FIGS. 1 and 2 show an information handling system 100. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more buses operable to transmit communications between the various hardware components.

The information handling system 100 includes a cooling portion 102 and a component portion 104. The cooling portion 102 includes a cooling fan 110, a baffle 112, devices 114, and an air duct 116. In an embodiment, the devices 114 can be dual inline memory modules (DIMMs), central processing units (CPUs), fan controllers, or the like. The baffle 112 includes a first portion 120 and a second portion 122. The component portion 104 includes a first component 130 and a second component 132. In an embodiment, the components 130 and 132 can be graphics processing units (GPUs), peripheral component interconnect express (PCIe) devices, or the like.

The first component 130 or the second component 132 can be placed in physical communication with the baffle 112 depending on the configuration of the component portion 104. For example, if the component portion 104 includes only the first component 130, as shown in FIG. 1, then the first component 130 is in physical communication with the baffle 112. However, if the component portion 104 includes both the first component 130 and the second component 132, then the second component 132 is placed in physical communication with the baffle 112, as shown in FIG. 2.

Referring now to FIG. 1, in the configuration with only the first component 130, the weight and position of the first component 130 within the component portion 104 can enable the baffle 112 to be in a first position within the air duct 116. In an embodiment, the first position of the baffle 112 can have the first portion 120 in an inclined position extending from the bottom of the air duct 116 up in an angle to the second portion 122. Also, in the first position of the baffle 112, the second portion 122 can be in a plane parallel with the bottom of the air duct 116 and that is aligned with the bottom of the first component 130. Additionally, when the baffle 112 is in the first position, a channel between the second portion 122 and a top of the air duct 116 can have a first height, H1. In an embodiment, the height, H1, and the width of the air duct 116 can cause a first area available for air flow to the component 130.

Referring now to FIG. 2, in the second configuration with both the first component 130 and the second component 132, the weight and position of the first and second components 130 and 132 can push the baffle 112 down into a second position. In an embodiment, when the baffle 112 is in the second position, the first portion 120 and the second portion 122 are both in physical communication with the bottom of the air duct 116. The first and second portions 120 and 122 both being in physical communication with the bottom of the air duct 116 can change the height of the air channel create between the second portion 122 and the top of the air duct 116 to a second height, H2. The baffle 112 in the second position can increase the area available for air flow at the first and second components 130 and 132 as compared to the area available when the baffle 112 is in the first position based on the increased height, from H1 to H2, of the air channel at the first and second components 130 and 132.

The different areas available for air flow between the first and second positions of the baffle 112 can enable the speed of the cooling fan 110 to change while maintaining the same velocity of air flow to the first component 130 or to the first and second components 130 and 132. In an embodiment, when the baffle 112 is in the first position, the speed of the fan 110 can be reduced as compared to the speed of the fan 110 when the baffle 112 is in the second position by the same percentage as the difference between the heights H1 and H2. For example, if the first height, H1, is half of the second height, H2, then the velocity of the air flow leaving the fan 110, when the baffle is in the first position, can be half of the velocity of the air flow leaving the fan 110 when the baffle is in the second position. However, the velocity of the air flow at the first component 130, while the baffle 112 is in the first position, can still be the same as the velocity of the air flow at the first and second components 130 and 132, while the baffle 112 is in the second position, based on the different areas available for the air flow at the components 130 and 132 between the first and second positions of the baffle 112.

In an embodiment, one of the devices 114 can be a fan controller that can change the speed of the fan 110 based on the configuration of the component portion 104. For example, if the fan controller 114 detects that only the first component 130 is within the component portion 104, then the fan controller 114 can set the fan 110 to a first speed. In an embodiment, the fan controller 114 can receive a signal indicating whether only the first component 130 or both the first and the second components 130 and 132 are located within the component portion 104. In an embodiment, the first speed of the fan 110 can cause the air flow at the fan 110 to have a first velocity. In this situation, the baffle 112 can be in the first position and as a result the area available for the air flow can be decreased from a point at the fan 110 to a point at the component 130, such that the velocity of the air flow can increase to a second velocity at the component 130. In an embodiment, the second velocity can be twice the first velocity.

If the fan controller 114 detects that both the first and second components 130 and 132 are within the component portion 104, then the fan controller 114 can increase the speed of the fan 110 to cause the velocity of the air flow to be the second velocity at the fan 110. In this situation, the baffle 112 is in the second position, such that the area available for air flow does not change from a point at the fan 110 to a point at the components 130 and 132. Thus, the velocity of the air flow is the same, such as the second velocity, both at components 130 and 132 and at the fan 110. However, in this configuration, the fan controller 114 causes the fan speed to be higher than in the configuration with only the first component 130 to produce the same velocity of the air flow at the components 130 and 132 in both configurations, such that more power is used by the fan 110 when the baffle 112 is in the second position than when the baffle is in the first position. Therefore, the changing of the position of the baffle 112 between the first and second positions depending on the configuration of the component portion 104 can enable power savings for the information handling system 100 when the component portion 104 only includes the first component 130 and the baffle 112 is in the first position as compared to when the component portion 104 includes both the first and second components 130 and 132 and the baffle 112 is in the second position.

Figure 3:
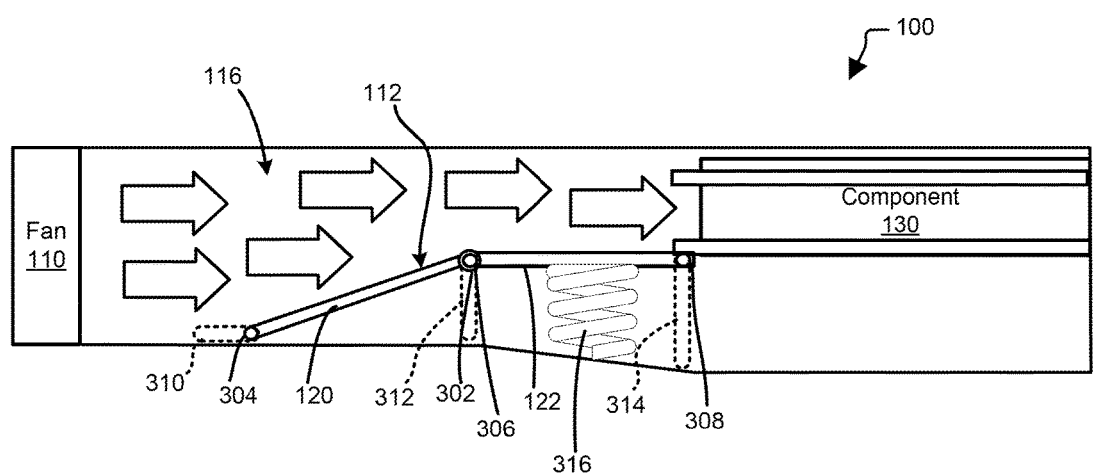
FIG. 3 is a diagram showing a side view of an air duct of the information handling system including the baffle in the first position according to at least one embodiment of the disclosure.
Figure 4:
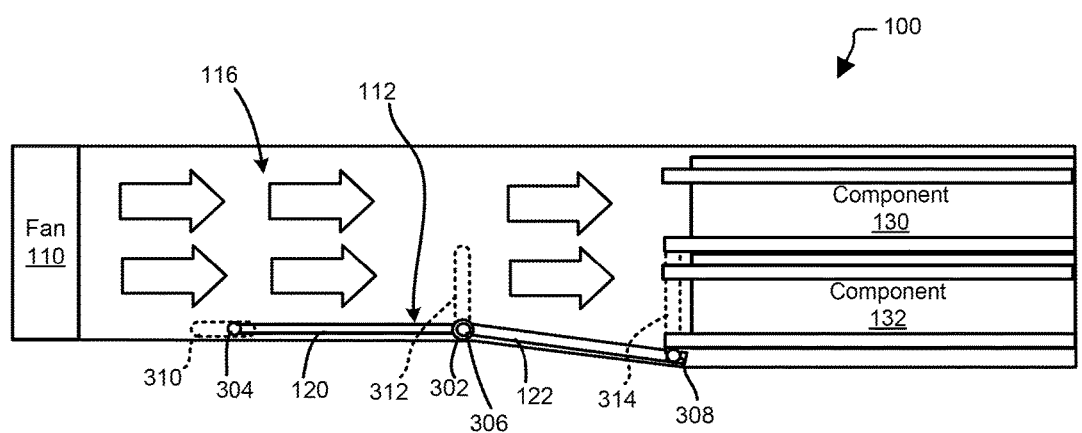
FIG. 4 is a diagram showing a side view of an air duct of the information handling system including the baffle in the first position according to at least one embodiment of the present disclosure.
Figure 5:
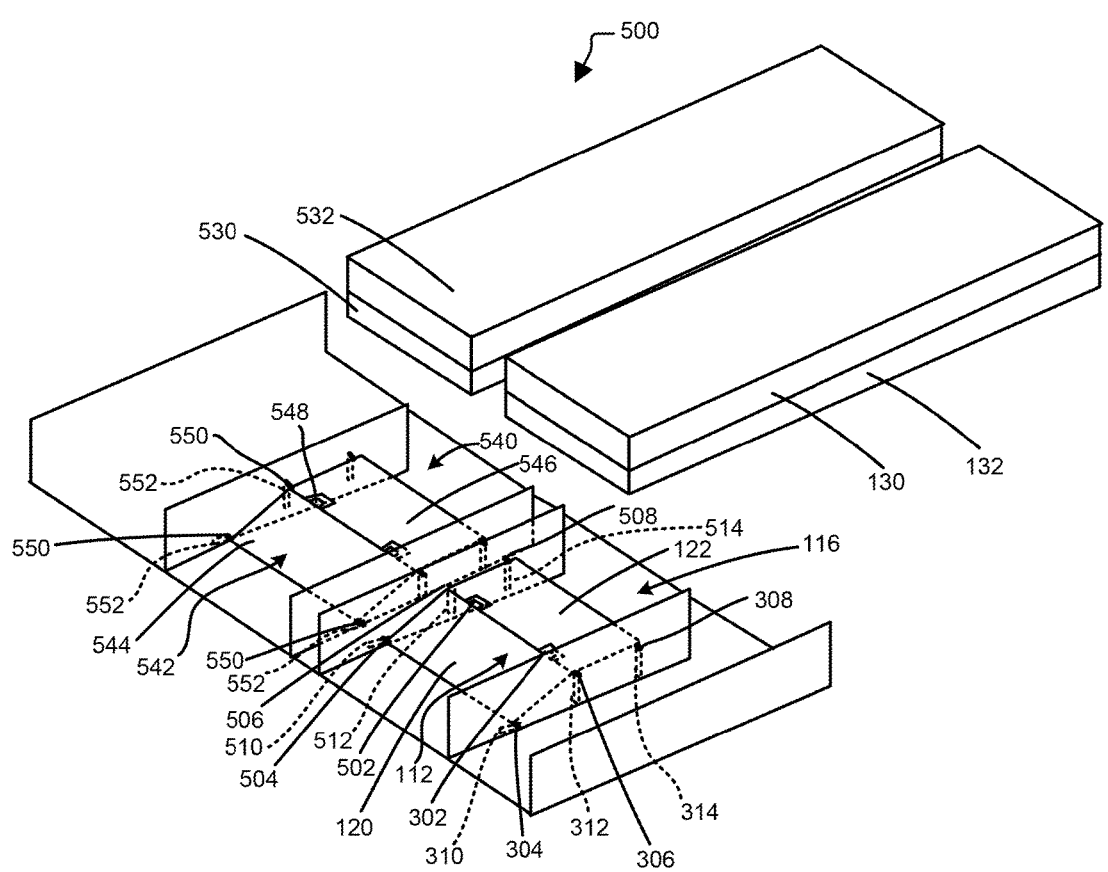
FIG. 5 is a diagram of another embodiment of the information handling system including multiple air ducts according to at least one embodiment of the present disclosure.

FIGS. 3 and 4 illustrate a side view of the air duct 116 of the information handling system 100 according to at least one embodiment of the present disclosure. The information handling system 100 includes the baffle 112, the air duct 116, and the component 130 or the components 130 and 132. The baffle 112 includes a hinge 302 to couple the first portion 120 with the second portion 122, and guide pins 304, 306, and 308. In an embodiment, baffle 112 also includes a second hinge 502, and guide pins 504, 506, and 508, as shown in FIG. 5, which perform the same functions as the hinge 302 and the guide pins 304, 306, and 308. However, for clarity and brevity the discussion of the operation of the baffle 112 will only be described with respect the hinge 302, and guide pins 304, 306, and 308. The air duct 116 includes guiding slots 310, 312, and 314 within a wall of the air duct 116. In an embodiment, air duct 116 also includes guiding slots 510, 512, and 514 within a second wall of the air duct 116, as shown in FIG. 5, which perform the same functions as the guiding slots 310, 312, and 314. However, for clarity and brevity the discussion of the operation of the baffle 112 will only be described with respect guiding slots 310, 312, and 314. The information handling system 100 also includes a spring 316 coupled in between a bottom surface of the air duct 116 and the second portion 122 of the baffle 112.

Referring now to FIG. 3, the spring 316 can bias the baffle 112 toward the first position by exerting a force upward on the second portion 122, which can cause the guide pins 306 and 308 to move upward to the top of the guiding slots 312 and 314, and cause the guide pin 304 to move horizontally within the guiding slot 310 until the guide pine 304 is at an end of the guiding slot 310 that is nearest to the component 130.

Thus, the spring 316, the guide pins 304, 306, and 308, and the guiding slots 310, 312, and 314 can hold the baffle 112 in the first position. While in the first position, the first portion 120 can be in an inclined position from the guide pin 304 within guiding slot 310 to the guide pin 306 within guiding slot 312. The second portion 122 can in a plane parallel to with the bottom of the component 130 in response to the location of the guide pine 306 within guiding slot 312 and the location of guide pin 308 within the guide slot 314. As shown in FIG. 3, the area available for the air flow decreases along the first portion 120 until the second portion 122, such that the fan 110 can consume less power and produce air flow within a lower velocity than the velocity desired at the component 130, but the decrease in the area available for the air flow at the component 130 can increase the velocity to the desired velocity at the component 130.

Referring now to FIG. 4, the weight of the components 130 and 132 can cause a downward force on the second portion 122 that is greater than the force exerted upward by the spring 316. In this situation, the guide pins 306 and 308 to move downward to the bottom of the guiding slots 312 and 314, and cause the guide pin 304 to move horizontally within the guiding slot 310 away from the end of the guiding slot 310 that is nearest to the component 130.

Thus, weight of the components 130 and 132, the guide pins 304, 306, and 308, and the guiding slots 310, 312, and 314 can hold the baffle 112 in the second position. While in the second position, the first portion 120 and the second portion 122 can both be in physical communication with the bottom of the air duct 116. As shown in FIG. 4, the area available for the air flow stays substantially the same along both the first portion 120 and the second portion 122, such that the fan 110 provides air flow with a velocity equal to the desired velocity at the components 130 and 132.

FIG. 5 is a diagram of another embodiment of the information handling system 500 including two air ducts 116 and 540 according to at least one embodiment of the present disclosure. The information handling system 500 includes a first baffle 112 located within the first air duct 116. The baffle 112 includes a first portion 120, a second portion 122, hinges 302 and 502, and guide pins 304, 306, 308, 504, 506, and 508. The air duct 116 includes guiding slots 310, 312, 314, 510, 512, and 514. The information handling system 500 also includes a second baffle 542 located with the second air duct 540. The baffle 542 includes a first portion 544, a second portion 546, hinges 548, and multiple guide pins 550. The air duct 540 includes multiple guiding slots 552. The information handling system 500 also includes components 130, 132, 150, and 152. In an embodiment, either only the component 130 or both components 130 and 132 can be placed within the air duct 116, and either only component 530 or both components 530 and 532 can be placed within the air duct 116.

The baffles 112 and 542 including the portions 120 and 122 of baffle 112 and the portions 544 and 546 of baffle 542, the hinges 302 and 502 of baffle 112 and the hinges 548 of baffle 542, and the guide pins 304, 306, 308, 504, 506, and 508 of baffle 112 and the guide pins 550 of baffle 542 can operate as described above for baffle 112 with respect to FIGS. 1-4. Similarly, the air ducts 116 and 540 including the guiding slots 310, 312, 314, 510, 512, and 514 of air duct 116 and the guiding slots 552 of air duct 540 can operate as described above for air duct 116 with respect to FIGS. 1-4. Thus, the information handling system 500 can save power in the fans of the air ducts 116 and 540 if only a single component is within each air duct based on the corresponding baffles 112 and 542 being in a first position as compared to when two components are within each air duct and the corresponding baffles 112 and 542 are in a second position.

Figure 6:
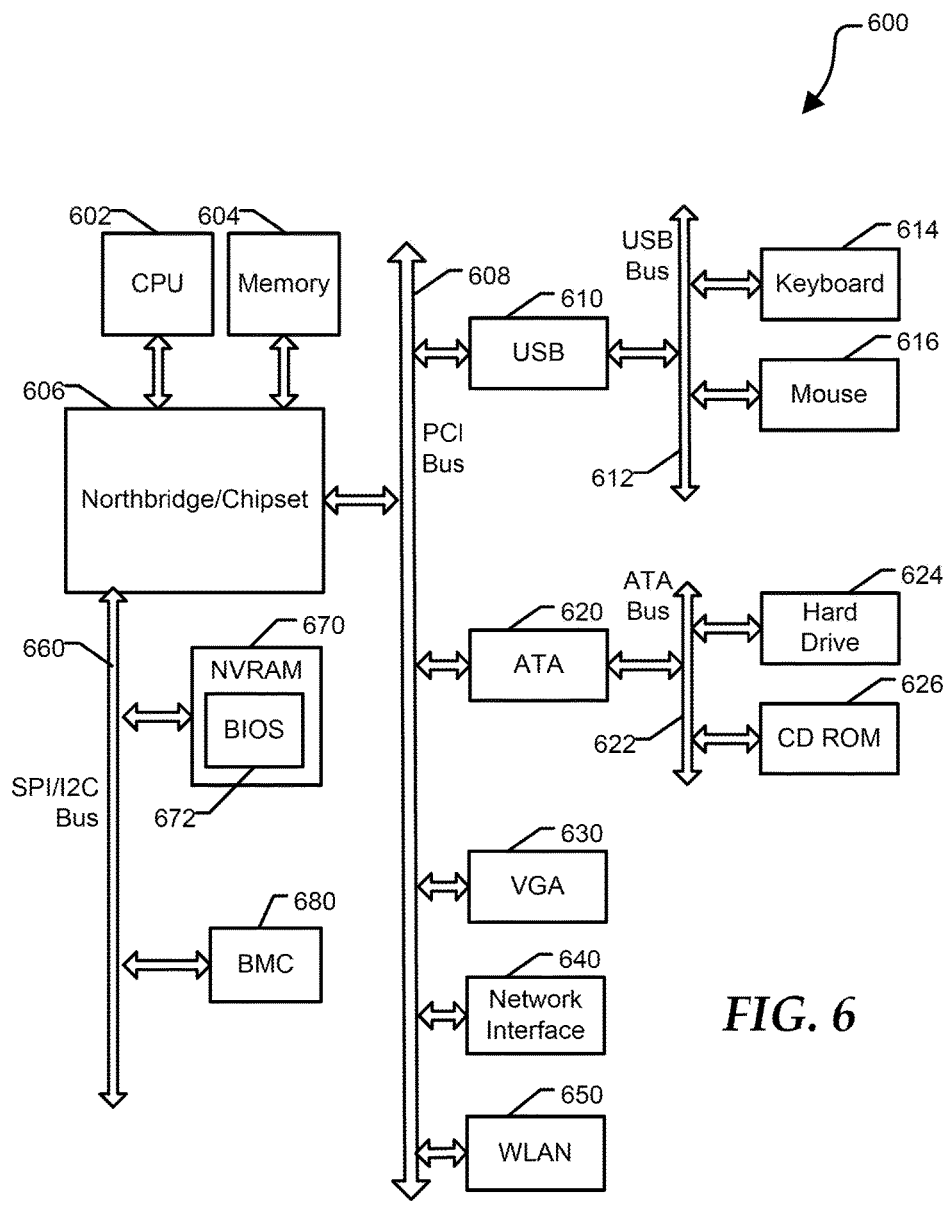
FIG. 6 is a block diagram of a general information handling system according to an embodiment of the present disclosure.

FIG. 6 illustrates a general information handling system 600 including a processor 602, a memory 604, a north-bridge/chipset 606, a PCI bus 608, a universal serial bus (USB) controller 610, a USB 612, a keyboard device controller 614, a mouse device controller 616, a configuration an ATA bus controller 620, an ATA bus 622, a hard drive device controller 624, a compact disk read only memory (CD ROM) device controller 626, a video graphics array (VGA) device controller 630, a network interface controller (NIC) 640, a wireless local area network (WLAN) controller 650, a serial peripheral interface (SPI) bus 660, a NVRAM 670 for storing BIOS 672, and a baseboard management controller (BMC) 680. BMC 680 can be referred to as a service processor or embedded controller (EC). Capabilities and functions provided by BMC 680 can vary considerably based on the type of information handling system. For example, the term baseboard management system is often used to describe an embedded processor included at a server, while an embedded controller is more likely to be found in a consumer-level device. As disclosed herein, BMC 680 represents a processing device different from CPU 602, which provides various management functions for information handling system 600. For example, an embedded controller may be responsible for power management, cooling management, and the like. An embedded controller included at a data storage system can be referred to as a storage enclosure processor.

For purpose of this disclosure information handling system 600 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 600 can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, information handling system 600 can include processing resources for executing machine-executable code, such as CPU 602, a programmable logic array (PLA), an embedded device such as a System-on-a-Chip (SoC), or other control logic hardware. Information handling system 600 can also include one or more computer-readable medium for storing machine-executable code, such as software or data.

System 600 can include additional processors that are configured to provide localized or specific control functions, such as a battery management controller. Bus 660 can include one or more busses, including a SPI bus, an I2C bus, a system management bus (SMBUS), a power management bus (PMBUS), and the like. BMC 680 can be configured to provide out-of-band access to devices at information handling system 600. As used herein, out-of-band access herein refers to operations performed prior to execution of BIOS 672 by processor 602 to initialize operation of system 600.

BIOS 672 can be referred to as a firmware image, and the term BIOS is herein used interchangeably with the term firmware image, or simply firmware. BIOS 672 includes instructions executable by CPU 602 to initialize and test the hardware components of system 600, and to load a boot loader or an operating system (OS) from a mass storage device. BIOS 672 additionally provides an abstraction layer for the hardware, such as a consistent way for application programs and operating systems to interact with the keyboard, display, and other input/output devices. When power is first applied to information handling system 600, the system begins a sequence of initialization procedures. During the initialization sequence, also referred to as a boot sequence, components of system 600 are configured and enabled for operation, and device drivers can be installed. Device drivers provide an interface through which other components of the system 600 can communicate with a corresponding device.

Information handling system 600 can include additional components and additional busses, not shown for clarity. For example, system 600 can include multiple processor cores, audio devices, and the like. While a particular arrangement of bus technologies and interconnections is illustrated for the purpose of example, one of skill will appreciate that the techniques disclosed herein are applicable to other system architectures. System 600 can include multiple CPUs and redundant bus controllers. One or more components can be integrated together. For example, portions of northbridge/chipset 606 can be integrated within CPU 602. Additional components of information handling system 600 can include one or more storage devices that can store machine-executable code, one or more communications ports for communicating with external devices, and various input and output (I/O) devices, such as a keyboard, a mouse, and a video display. An example of information handling system 600 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

Information handling system 600 can include a set of instructions that can be executed to cause the information handling system to perform any one or more of the methods or computer based functions disclosed herein. The information handling system 600 may operate as a standalone device or may be connected to other computer systems or peripheral devices, such as by a network.

In a networked deployment, the information handling system 600 may operate in the capacity of a server or as a client user computer in a server-client user network environment, or as a peer computer system in a peer-to-peer (or distributed) network environment. The information handling system 600 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 600 can be implemented using electronic devices that provide voice, video or data communication. Further, while a single information handling system 600 is illustrated, the term "system" shall also be taken to include any collection of systems or sub-systems that individually or jointly execute a set, or multiple sets, of instructions to perform one or more computer functions.

The information handling system 600 can include a disk drive unit and may include a computer-readable medium, not shown in FIG. 6, in which one or more sets of instructions, such as software, can be embedded. Further, the instructions may embody one or more of the methods or logic as described herein. In a particular embodiment, the instructions may reside completely, or at least partially, within system memory 604 or another memory included at system 600, and/or within the processor 602 during execution by the information handling system 600. The system memory 604 and the processor 602 also may include computer-readable media.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
    a component portion that includes a first component and a second component, wherein the first component is disposed on top of the second component; and
    a cooling portion that includes:
        an air duct;
        a cooling fan disposed at one end of the air duct to provide an air flow toward the first and second components that are disposed at another end of the air duct; and
        a baffle disposed within the air duct and in physical communication with the first and second components, the baffle including:
            a first portion;
            a second portion that is coupled by a hinge to the first portion, wherein the first and second portions form a first position to guide the air flow to the first component and form a second position to guide the air flow to the first and second components, wherein the first position includes the second portion in plane parallel with a bottom of the air duct and aligned with a bottom of the first component and the first portion extending in an inclined position from the bottom of the air duct to the hinge, wherein the second position includes the first portion and the second portion in physical communication with the bottom of the air duct; and
            a spring in physical communication with a bottom surface of the second portion and the bottom of the air duct, wherein a weight of the first and second components causes the spring to compress and form the second position.

2. The information handling system of claim 1, wherein the air duct includes multiple guiding slots to direct movement of the baffle from the first position to the second position and vice-versa.

3. The information handling system of claim 2, wherein the multiple guiding slots include:
    a first guide pin inserted through a horizontal first guiding slot on the bottom of the air duct, wherein the first guiding slot facilitates horizontal movement of the first guide pin that attaches one end of the first portion to the bottom of the air duct;
    a second guide pin inserted through a vertical second guiding slot; and
    a third guiding pin inserted through a vertical third guiding slot, wherein the second and third guiding slots facilitate upward and downward movements of the second and third guiding pins from the first position to the second position and vice-versa.

4. The information handling system of claim 3, wherein the first guiding slot is positioned to enable the first guide pin to move in a first direction, and the second guiding slot is positioned to enable the second guide pin to move in a second direction perpendicular to the first direction.

5. The information handling system of claim 3, wherein the first position forms a first channel height between a planar surface of the second portion and a top of the air duct.

6. The information handling system of claim 5, wherein the second position forms a second channel height between the planar surface of the second portion and the top of the air duct, wherein the second channel height is higher than the first channel height.

7. The information handling system of claim 1, wherein one or more components are graphic processing units.

8. The information handling system of claim 1, wherein one or more components are peripheral component interconnect express devices.

9. The information handling system of claim 1, the baffle to form a first area available for the air flow when the baffle is in the first position, and to form a second area available for the air flow when the baffle is in the second position.

10. The information handling system of claim 9, wherein the first area is less than the second area.

11. The information handling system of claim 9, wherein a velocity of the air flow at the first component when the baffle is in the first position is the same as a velocity of the air flow at both the first and second components when the baffle is in the second position.

12. An information handling system comprising:
    a component portion that includes a first component and a second component; and
    a cooling portion that includes:
        an air duct;
        a cooling fan disposed at one end of the air duct to provide an air flow to the first and second components that are disposed at another end of the air duct;
        a baffle in physical communication with the first and second components, wherein the baffle includes:
            a first portion;
            a second portion that is coupled by a hinge to the first portion, wherein the first and second portions form a first position to guide the air flow toward the first component and form a second position to guide the air flow toward the first and second components, wherein the first position includes the second portion in plane parallel with a bottom of the air duct and aligned with a bottom of the first component and the first portion extending in an included position from the bottom of the air duct to the hinge, wherein the second position includes the first portion and the second portion in physical communication with the bottom of the air duct; and
            a spring in physical communication with a bottom surface of the second portion and the bottom of the air duct wherein a weight of the first and second components causes the spring to compress and form the second position; and a fan controller in communication with the cooling fan, wherein the fan controller is configured to set the cooling fan to a first speed in response to the first and second portions forming the first position and to set the cooling fan to a second speed in response to the first and second portions forming the second position.

13. The information handling system of claim 12, wherein the air duct includes:
a first guide pin inserted through a horizontal first guiding slot on the bottom of the air duct, wherein the first guiding slot facilitates horizontal movement of the first guide pin that attaches one end of the first portion to the bottom of the air duct;
a second guide pin inserted through a vertical second guiding slot, wherein the second guide pin is connected to the first and second portions; and
a third guiding pin inserted to a vertical third guiding slot, wherein the second and third guiding slots facilitate upward and downward movements of the second and third guiding pins from the first position to the second position and vice-versa.

14. The information handling system of claim 12, wherein the weight of the first and second components causes a second channel height between a planar surface of the second portion and a top of the air duct, wherein the second channel height is higher than a first channel height during the first position.

15. The information handling system of claim 12, the baffle to form a first area available for the air flow when the baffle is in the first position, and to form a second area available for the air flow when the baffle is in the second position.

16. The information handling system of claim 15, wherein a velocity of the air flow at the first component when the baffle is in the first position is the same as a velocity of the air flow at both the first and second components when the baffle is in the second position.

17. An information handling system comprising:
a component portion that includes a first component and a second component, wherein the first component is disposed on top of the second component; and
a cooling portion that includes:
an air duct that facilitates an air flow toward the first and second components;
a cooling fan disposed at one end of the air duct to provide the air flow toward the first and second components that are disposed at another end of the air duct;
a baffle in physical communication with the first and second components, wherein the baffle includes:
a first portion;
a second portion that is coupled by a hinge to the first portion, wherein the first and second portions form a first position to guide the air flow toward the first component and form a second position to guide the air flow toward the first and second components, wherein the first position includes the second portion in in plane parallel with a bottom of the air duct and aligned with a bottom of the first component and the first portion extending in an inclined position from the bottom of the air duct to the hinge, wherein the second position includes the first portion and the second portion in physical communication with the air duct; and
a spring disposed in between a bottom surface of the second portion and the bottom of the air duct, wherein a weight of the first and second components causes the spring to compress and facilitates the formation of the second position; and
a fan controller in communication with the cooling fan, the fan controller to adjust air flow velocity from a first speed to a second speed in response to a change of position of the baffle from the first position to the second position, wherein the second speed uses more power than the first speed.

18. The information handling system of claim 17, wherein the first position and the second position form a first channel height and a second channel height, respectively, wherein the second channel height is higher than the first channel height.

19. The information handling system of claim 17, the baffle to form a first area available for the air flow when the baffle is in the first position, and to form a second area available for the air flow when the baffle is in the second position.

20. The information handling system of claim 19, wherein the velocity of the air flow at the first component when the baffle is in the first position is the same as a velocity of the air flow at both the first and second components when the baffle is in the second position.

\* \* \* \* \*